US006321186B1

(12) United States Patent
Yuan et al.

(10) Patent No.: US 6,321,186 B1
(45) Date of Patent: Nov. 20, 2001

(54) METHOD AND APPARATUS FOR INTEGRATED CIRCUIT DESIGN VERIFICATION

(75) Inventors: Jun Yuan; Carl P. Pixley; Stephen Kurt Shultz, all of Austin, TX (US); Hillel Miller, Herzelia (IL)

(73) Assignee: Motorola, Inc., Schaumburg, IL (US)

(*) Notice: Subject to any disclaimer, the term of this patent is extended or adjusted under 35 U.S.C. 154(b) by 0 days.

(21) Appl. No.: 09/303,995

(22) Filed: May 3, 1999

(51) Int. Cl.[7] .................................................... G06F 17/50
(52) U.S. Cl. .................................. 703/15; 703/14; 716/5
(58) Field of Search ...................... 703/14–16; 716/4–6

(56) References Cited

U.S. PATENT DOCUMENTS

| | | | |
|---|---|---|---|
| 5,910,897 | * | 6/1999 | Dangelo et al. |
| 5,920,490 | * | 7/1999 | Peters ......................................... 716/2 |
| 5,933,356 | * | 8/1999 | Rosotoker et al. ......................... 703/15 |
| 5,953,236 | * | 9/1999 | Hossain et al. ............................ 716/6 |
| 6,086,626 | * | 7/2000 | Jain et al. .................................. 716/5 |
| 6,131,078 | * | 10/2000 | Plaisted ....................................... 703/2 |
| 6,216,252 | * | 4/2001 | Dangelo et al. ............................ 716/6 |
| 6,253,365 | * | 6/2001 | Baldwin ..................................... 703/13 |

OTHER PUBLICATIONS

Jun Yuan, et al., "SimGen: A Tool for Automatically Generating Simulation Environments from Constraints", submitted FMCAO 1998 Formal Methods in Computer Aided Design, 18 pgs.

Sited at Wed Address http://www.versity.com/html/default-_productspecman.html, Specman Data Sheet, Sep. 22, 1998, pp. 1–2.

Sited at Web Address http://www.cl.cam.ac.uk/Research/HVG/AR_abstracts/abstract_911107.html, Formal Hardware Verification by Symbolic Simulation, Jul. 16, 1998, p. 1.

Sited at Web Address http://www.cl.cam.ac.uk/Research/HVG/AR_abstracts/abstract_970522.html, Formal Verification of the Fairisle ATM Switch using Multiway Decision Graphs, Jul. 16, 1998, p. 1.

Gergov et al., "Efficient Boolean Manipulation with OBDD's Can be Extended in FBDD's", IEEE Transactions on Computers, vol. 43, Issue 10, pp. 1197–1209, Oct. 1994.*

Chandra et al., "AVPGEN—A Test Generator for Architecture Verification", IEEE Transactions on Very Large Scale Integration Systems, vol. 3, Issue 2, pp. 188–200, Jun. 1995.*

Rajan et al., "Industrial Strength Formal Verification Techniques for Hardware Designs", Tenth International Conference on VLSI Design, pp. 208–212, Jan. 1997.*

Hu, A. J., "Formal Hardware Verification with BDDs; An Introduction", IEEE Pacific Rim Conference on Communications, Computers and Signal Processing, vol. 2, pp. 677–682, Aug. 1997.*

Yuan et al., "Modeling Desing Constraints and Biasing in Simulation Using BDDs", IEEE/ACM International Conf. on Computer–Aided Design, Digest of Technical Papers, pp. 584–589, Nov. 1999.*

* cited by examiner

*Primary Examiner*—Kevin J. Teska
*Assistant Examiner*—Douglas W. Sergent

(57) ABSTRACT

A method for verifying an integrated circuit design using constraint information to develop a weighted data structure. In one embodiment, a binary decision diagram (BDD) includes a plurality of nodes (401, 402, 403, 404, 405, 406, 407, 420, and 430) representing signals and states in the circuit, and each node has a branching probability based on user-defined weights. The BDD represents the intersection of the input space and state space which satisfies the constraints. Current state information resulting from simulation is used to dynamically adjust the branching probabilities of the BDD on the fly. In one embodiment, the constraint information is applicable for formal verification of a portion of the circuit. In another embodiment, a simulation controller (12) receives design and constraint information and generates the program to control simulator (14).

17 Claims, 5 Drawing Sheets

METHOD AND APPARATUS FOR INTEGRATED CIRCUIT DESIGN VERIFICATION

FIELD OF THE INVENTION

The present invention relates generally to integrated circuit design, and specifically to verification of design using a logic data structure.

BACKGROUND OF THE INVENTION

Verification of integrated circuit design is a complex activity involving a variety of methods and tools. Design verification is used to eliminate errors prior to the actual manufacture of integrated circuits. By eliminating as many errors as possible prior to manufacturing, the overall cost of implementing a specific integrated circuit design is reduced. Various types of design verification include: simulation techniques, emulation techniques, and formal or static verification techniques.

Simulation techniques include providing test vectors to a simulator to determine whether or not an integrated circuit functions in an expected manner. One problem with using such simulation techniques as a form of design verification is that the amount of time coupled with the number of vectors needed to properly verify a design can be prohibitive. In other words, the number of sequences of vectors needed to thoroughly verify a modern integrated circuit design can run into billions or trillions of vector sequences. To develop this many vector sequences requires a prohibitive amount of time using modem simulation techniques.

Another method of design verification is the physical emulation of the integrated circuit design. Emulation techniques down load circuit definitions into hardware emulators. Generally, these emulators consist of field programmable gate arrays (FPGA's) capable of executing test vectors at speeds several orders of magnitude faster than simulations. However, even using emulation techniques, it is possible for errors to go undetected during design verification. This is the case when test sequences implemented by the emulator are not exhaustive, i.e. they do not create a condition capable of detecting an error.

Yet another form of design verification is the use of a formal verification or static verification check. Formal verification deterministically checks integrated circuit designs based upon predefined conditions or constraints. One such formal verification technique is put forth in the pending U.S. patent application entitled "Method for Performing Model Checking in Integrated Circuit Design" by Matthew J. Kaufmann, et al. filed on Dec. 31, 1997, having application Ser. No. 09/001,751, having a common assignee as the present application, and which is hereby incorporated by reference.

One advantage of using formal verification, is that through formal verification techniques, it is possible to exhaustively perform design verification. In other words, for specified constraints it is possible to exhaustively determine whether or not conditions are met within a current integrated circuit design. However, due to the overhead associated with formal verification techniques, the amount of time and computer memory used to perform formal verification increases exponentially based upon the size of the circuit being checked. In other words, formal verification has a limitation in that for large models or circuits, it is impractical.

Therefore, a new method of performing design verification on large circuit models would be desirable.

DETAILED DESCRIPTION OF THE DRAWINGS

Figure 1:
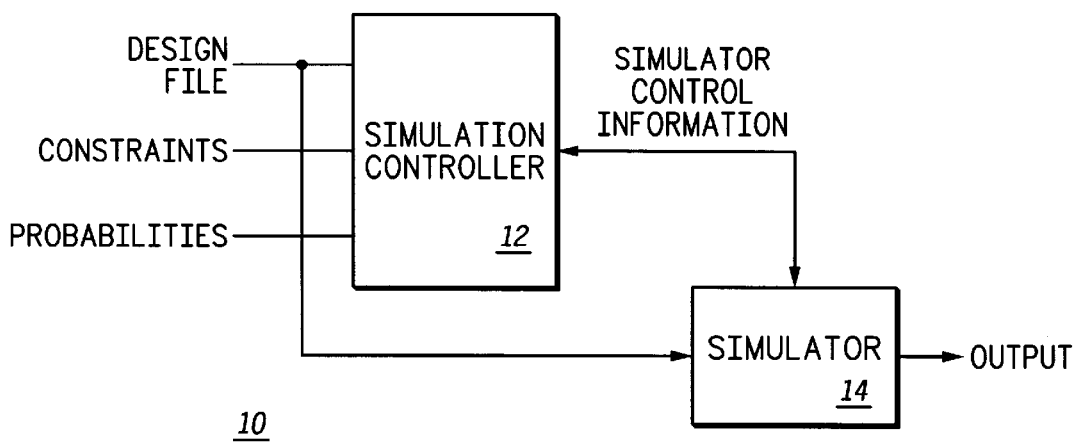
FIG. 1 illustrates, in block diagram form, a system for performing design verification in accordance with one embodiment of the present invention.

The present invention provides a method of verification of the design of integrated circuits, where the method is bound by a set of functional constraints which describe the circuit. A logic data structure, such as a binary decision diagram (BDD) is used to represent the circuit functionally. The logic data structure includes a plurality of nodes, each having a predetermined weight corresponding to the designer's intention for that node. According to one embodiment, by weighting the BDD, a more accurate simulation of the design is available. Nodes may represent input signals, internal state signals, or any other internal quantifiable functional variable affecting the design. A simulation controller provides a set of simulation inputs to a simulator, where the simulation inputs are based on the logic data structure and the probabilities that a node will be in a given state. The simulation controller receives present state information from the simulator, and adjusts the weights and probabilities of the BDD accordingly. The state information is then dynamically incorporated into the BDD. According to one aspect of the present invention, it is possible to use a formal verification method to verify at least a portion of the integrated circuit design using the set of functional constraints. In this way, both simulation and formal verification are used to verify the design.

The simulation controller generates a sequence of test vectors as input to the simulator. The sequence of test vectors defines an input space which satisfies the set of design constraints for the circuit. The simulation controller generates a program to control the simulator and then links to the simulator. The program is based on the logic data structure.

According to one aspect of the present invention, a method for verifying a design of an integrated circuit having a set of functional constraints first generates a logic data structure based on the set of functional constraints, where the logic data structure comprises a plurality of nodes representing functional signals and each of the input signals has a predetermined weight. A node weight is then computed for each of the plurality of nodes based on the predetermined input weight. The method continues by generating a first set of simulation inputs based on the logic data structure and probabilities, and then simulating the integrated circuit design using the first set of simulation inputs to initialize the circuit's state.

According to another aspect of the invention, a circuit design verification tool includes a logic compiler and a control program generator. The logic compiler receives a design file, and a set of design constraints. The logic compiler builds a logic data structure to represent an input space which satisfies the set of design constraints. The control program generator receives the logic data structure from the logic compiler and generates a simulation control program based on the logic data structure.

In an alternate embodiment, a circuit design verification tool is stored via storage media. The storage media includes a means for receiving design file information and design constraint information; a second means for generating a weighted binary decision diagram (BDD) data structure, the weighted BDD having a plurality of binary nodes corresponding to functional signals within a circuit, each of the plurality of binary nodes having two edges; and a third means for generating simulation controls based on the weighted BDD, the third means assigning an associated branching probability to each edge.

According to another embodiment of the present invention a circuit design verifier is stored on a computer readable medium. The design verifier is for verifying the design of an integrated circuit having a set of functional constraints. The circuit design verifier includes a means for generating a logic data structure based on the set of functional constraints, a means for assigning a node weight to each of the plurality of nodes based on the predetermined input weight, a means for generating a first set of simulation inputs based on the logic data structure and probabilities, and a means for simulating the integrated circuit design using the first set of simulation inputs. The logic data structure includes a plurality of nodes, where each of the plurality of nodes represents an input signal or internal signal to the integrated circuit, and each of the input signals has a predetermined weight.

Specific embodiments of the present invention are best understood with reference to the drawings. FIG. 1 illustrates a system 10 comprising a simulation controller 12, and a simulator 14. The simulation controller 12 receives design file information, constraint information, and probability or weighting information. In turn, the simulation controller 12 is bi-directionally coupled to the simulator 14 in order to provide and receive simulator control information. In addition, the simulator 14 receives design file information and provides output information.

Generally, the design file information received by the simulation controller 12 and the simulator 14 are in an industry standard netlist format such as a Verilog, or other industry standard, or proprietary format. The design file information generally includes design information in a behavioral or in a physical description form. Design file information provides sufficient information to describe the designed circuit functionally.

Many inputs to a design are subject to constraints. Constraints are the assumptions on which the design is based. Input constraints may be expressed as any boolean expression involving signals within the design. This often includes signals internal to the design, states within the design and input signals. For example, consider a bus controller, where the address state machine is only allowed to assert a "transaction start" input if the design in an "address idle" state. This is a constraint of the design, as the design is based on this assumption, and a signal within the design is governed by the condition. The boolean formula representing this constraint is provided as:

$constraint(ts ->(addr_state=='ADDR_IDLE))

where the transfer start signal is identified as "ts," and the address state signal is identified as "addr_state," and address idle corresponds to the "'ADDR_IDLE." state. As stated in the boolean expression, whenever "addr_state" is not in state'ADDR_IDLE, the signal "ts" may not be asserted. Conversely, if "ts" is asserted, it is implied that "addr_state" is in the 'ADDR_IDLE state.

The constraints received by simulation controller 12 are used to specify the relationships between various input values and circuit states. In a specific embodiment, the constraints are consistent with or the same as the constraints previously disclosed in U.S. patent application Ser. No. 9,001,751, which is herein incorporated by reference.

The use of constraints set forth in this manner provide an improvement over the use of controlled vector generation through the actual input of higher level programming languages defining specific manners in which simulations are generated. Specific embodiments of the present invention use constraints to generate test simulation vectors for specific modules in one embodiment of the present invention. In addition, in a specific embodiment, the constraints can also be used to monitor inputs to their associated module once the module is utilized as a sub-block to a larger module.

The probability, or weighting, information provided to the simulation controller 12, can provide relative weighting information among vector specified input values. In other words, if a specific input is intended to have a specific value more often than a second input, it is possible to weight the first input greater level than the second input. The simulation controller 12 is linked to the simulator 14. Generally, in operation, the simulator 14 can be controlled by the simulation controller 12 to monitor the internal states of the design file being simulated in order to determine subsequent simulator vectors to be executed by the simulator 14, or the simulation. By monitoring specific states of the design file being simulated within the simulator 14, the simulation controller 12 makes decisions as to what a next input vector should look like. The output from the simulator 14 is of the type format common in the industry, such as an output timing diagram illustrating relationships allowing subsequent analysis by a user.

Figure 2:
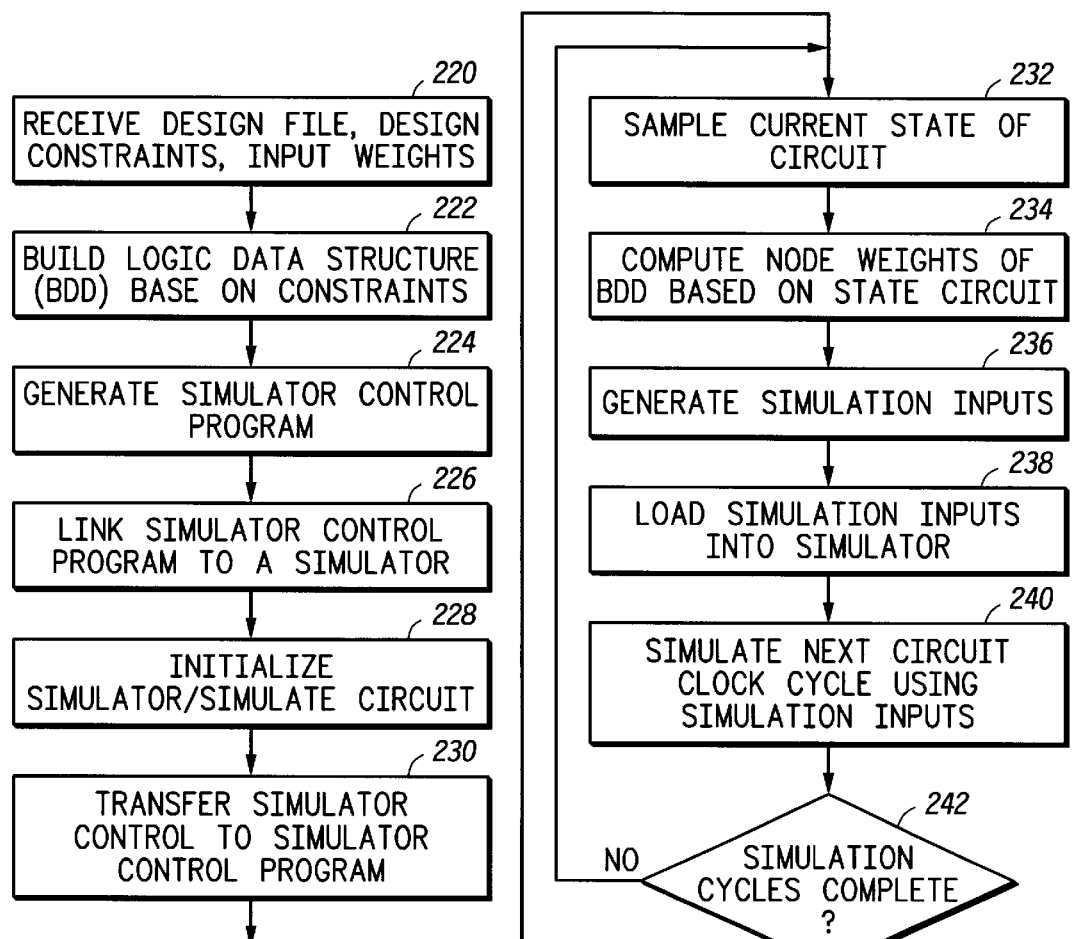
FIG. 2 illustrates, in flow diagram form, a method for implementing one implementation of the present invention.

FIG. 2 illustrates in flow diagram form, a specific embodiment of the present invention. The flow diagram of FIG. 2 is best understood with reference to FIGS. 3–7. At step 220 the design file information, constraint information, and input weight information is received by the simulation controller 12.

At step 222, a logic data structure, such as a BDD, is constructed based on the constraint information. One embodiment of the present invention employs an ordinary binary decision diagram, as described by R. Bryant in the paper entitled "Graph-based Algorithms for Boolean Function Manipulation," IEEE Transactions on Computers, C-35:677–691, August 1986. The use of such a data structure allows implicit representation of constraints. A BDD can be defined recursively as a root node with two sub-BDDs. A BDD has two terminal nodes, sometimes referred to as a leaf, namely ONE and ZERO. The two terminals could also be referred to as TRUE and FALSE. Each non-terminal node is associated with a variable, i.e., a signal, which may include a state of the design or an input variable. The BDD is traversed by a path which continues from the top node to the terminal nodes. As the path goes through a node it will branch left or right to a next sub-BDD based on the truth assignment of the variable of the node. On any path a variable can be visited at most once, and the order the variables are visited conforms to a global ordering.

For any given state of a design, there is a possibly empty set of paths to a final TRUE node which satisfies the constraints of the design. If there are no paths which result in a final TRUE node, then the set is empty and the state is rejected as not satisfying the constraints. Note that valid inputs are dynamic, changing with changes in the state of the design. In this way, valid inputs are dependent on state information.

Continuing at step 222 of FIG. 2, as an example, a specific constraint could be represented in a design file, or other file by the following constraint statement:

$constraint(Q->0+IN0+IN1+IN2==1)

where Q is a state internal to the design. Q may represent the output of a latch, or the binary value of a register bit, or an internal signal, or any other state within the design. For clarity, in the remainder of this discussion Q will represent a latch state within the design. Similarly, a true state will be represented as a logical one, and a false state will be represented as a logical zero. Alternate embodiments and other designs may employ other notations, polarities, and/or conventions. The example constraint statement given above indicates that when Q is true (i.e., valid) then only one of inputs IN0, IN1, and IN2 is set to be exactly one at a given time. In other words, if both input IN1 and input IN2 were set to one, their sum would not equal one as indicated in the constraint statement, and the state Q would then have to be false. From the other perspective, when Q is true, then one and exactly one of inputs IN0, IN1, and IN2 is set equal to one. Note that the above constraint places no limitations on the values of the inputs IN0, IN1 and IN2 when Q is not true. Based upon this constraint information, it is possible to build a logic data structure, such as the BDD as illustrated in FIG. 4.

Figures 3, 4:
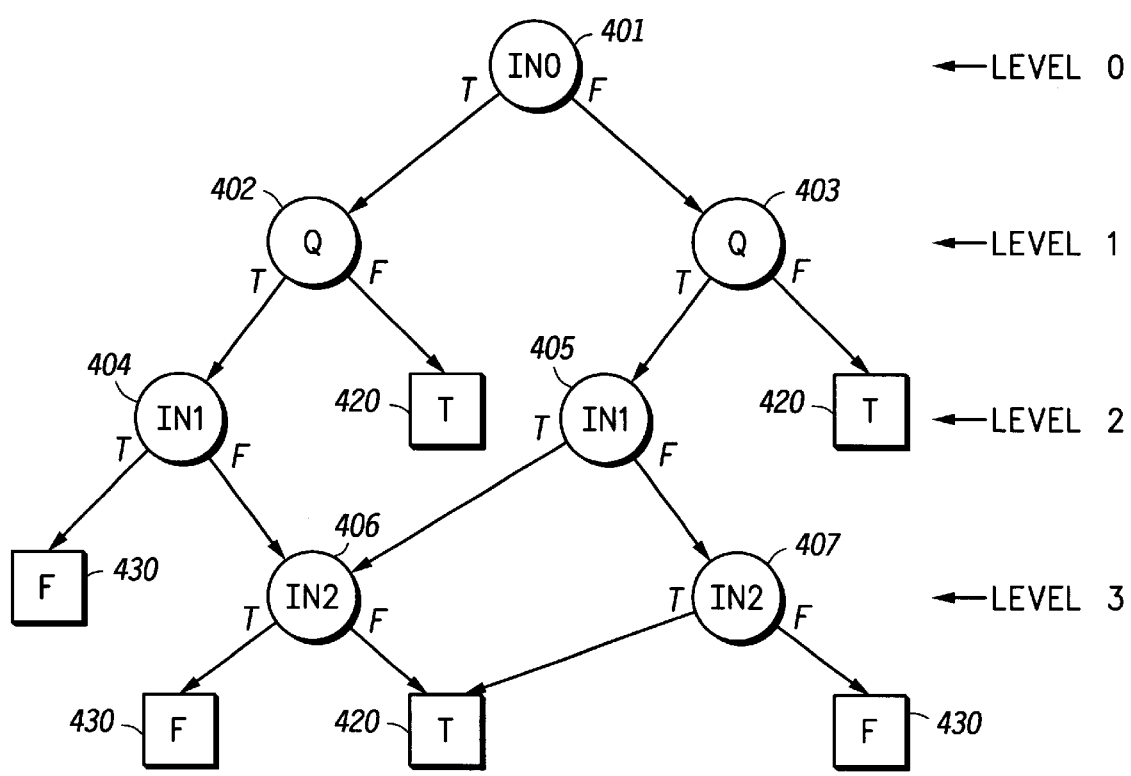
FIG. 3 table of input weights according to one embodiment of the present invention.
FIGS. 4–7 illustrate, in binary decision diagram form, a logic data structure in accordance with the present invention.

FIG. 4 illustrates one specific logic data structure that could be used to implement the present invention. It should be noted however that other logic data structures, such as a binary movement diagram (BMD) or a Zero-Suppressed Decision Diagram (ZDD) may be used as well. The BDD of FIG. 4 has four levels, level 0 through level 3. Level 0 represents the input variable IN0, level 1 represents the state Q, level 2 represents the IN1 variable, and level 3 represents the IN2 variable.

The BDD is a directed graph which is traversed as a set of paths, each starting from level 0 and proceeding downward based on the condition or state at a node in each level. For example, at level 1 if IN0 is "true" the path proceeds from node 401 to node 402, but if IN0 is "false" the path proceeds from node 401 to node 403. This is indicated as the true branch from node 401 points to node 402, while the false branch from node 401 points to node 403, where direction is indicated by arrows. In this way, a combination of conditions and states are considered until a final result is obtained, either true or false. To satisfy the set of constraints on which the design is based, the final result must be a true.

From an individual node there are typically two possible paths, and the arrows indicate the next decision node resulting from a given path. For example, from node 405 the true branch points to node 406 to determine if the input IN2 is true or false. Similarly, the false branch from node 405 points to node 407 to determine if the input IN2 is true or false. However, from node 406 a false branch results in a true state at node 420, whereas from node 407 a false branch results in a false state at node 430. By traversing the BDD it is possible to consider every possible combination of input variable and Q state variable.

Returning to FIG. 2, continuing with step 222, weights are assigned to each of the input signals. The weight is the designer's indication of the intent that that input signal will be true, i.e. intent that the true branch from a node representing that input signal will be taken. The actual weight assignment may be accomplished in several manners. For example, in one embodiment the actual weight is allocated to the node itself. FIG. 3 indicates a table having weighted true branch values for each of the three input signals IN0, IN2, and IN3. In this example, IN0 has a true branch weight of 0.8, IN1 has a true branch weight of 0.5, and IN2 has a true branch weight of 0.2. In a second embodiment, an input's true branch weight is stored in a table, wherein the table records the weight of each input signal. All nodes representing the same input have the same input weight. The true branch weight reflects the designer's intended tendency for the input to be true and therefore the true branch will be taken. The false branch weight is then complement of the true branch, or:

(false branch weight)=1−(true branch weight).

Determination of the true path weight therefore provides the false branch weight also. The true path weight is introduced by the designer, and reflects the bias of the design for choosing that input signal to be true. It should be understood that the true branch weight is not the probability that a true branch will be chosen.

Each node also has an associated probability, which is an indication of whether that node will lead to a final TRUE result. In other words, whether this node is on a path which satisfies the set of constraints. Note that the size of the BDD is dependent upon the function it represents, but is defined by the ordering of variables. Dynamic reordering is available to reduce the size of the BDD while maintaining the function desired. It is also possible to partition the constraints into sets having disjoint input variable support. Each set of constraints sharing inputs is conjoined to form a partitioned constraint BDD. As each partitioned constraint BDD has only input variables which are not included in any other BDD, the function of the design is maintained and each partitioned constraint BDD may be handled separately. Alternate embodiments may employ other methods of reducing the size of the BDD as long as the function of the design is maintained.

Where the node represents an input signal, the value of the input signal may not be uniformly distributed. Improved simulation results consider the probability of a given input signal value. According to one embodiment of the present invention, satisfying input constraints takes priority over satisfying input probabilities. For example, consider the case where an input is assigned a high probability of being true, but the design rarely enters a state during simulation in which a true state is a valid assignment for that input. To resolve this contention, a constrained probability set of vectors may be employed. The constrained probability of selecting a vector is the weight of this vector over the sum of the weights of all vectors satisfying the constraint. While the designer designates the weight of the true branch for the node, the sample space of the simulation is the set of vectors satisfying the constraints and therefore the probability of the node being true may not equal the weight the designer has selected. Even so, the probability intuitively follows the trend of signal probabilities. For example, if an input has a high probability of being true, then a vector which sets the input to true has a higher constrained probability.

In one embodiment, the probabilities are incorporated into the BDD to compute the local probability of branching at each node in the BDD. Vectors are then generated based on the branching probabilities. The BDD includes input nodes, representing input variables, and state nodes, representing state variables. In a basic BDD tree structure, variable ordering places state variables before input variables. On each path starting from the root of the constraint BDD, all state nodes occur before all input nodes. The first input node encountered on such a path is the root of a sub-BDD which represents the set of valid vectors under the set of states represented by the path. The sub-BDD then contains no state nodes. This structure allows implementation of dynamic biasing which considers state information in the computation of branching probabilities.

State information can be considered in the computation of branching probabilities by defining the probability of assigning an input to 1 as a function of state variables. Such a definition can be introduced by the user by providing an expression, for example in Verilog or VHDL. Such an expression may involve any state variables of the design. The expression evaluates to a number between 0 and 1 when state variables assume specific values depending upon the current state of the design. For example, the following makes it more likely to assign the reset input to the value 1 when in the error state, and less likely when not:

$simgen("setprob1", "reset", state==ERROR ?0.9:0.1).

Figure 5:
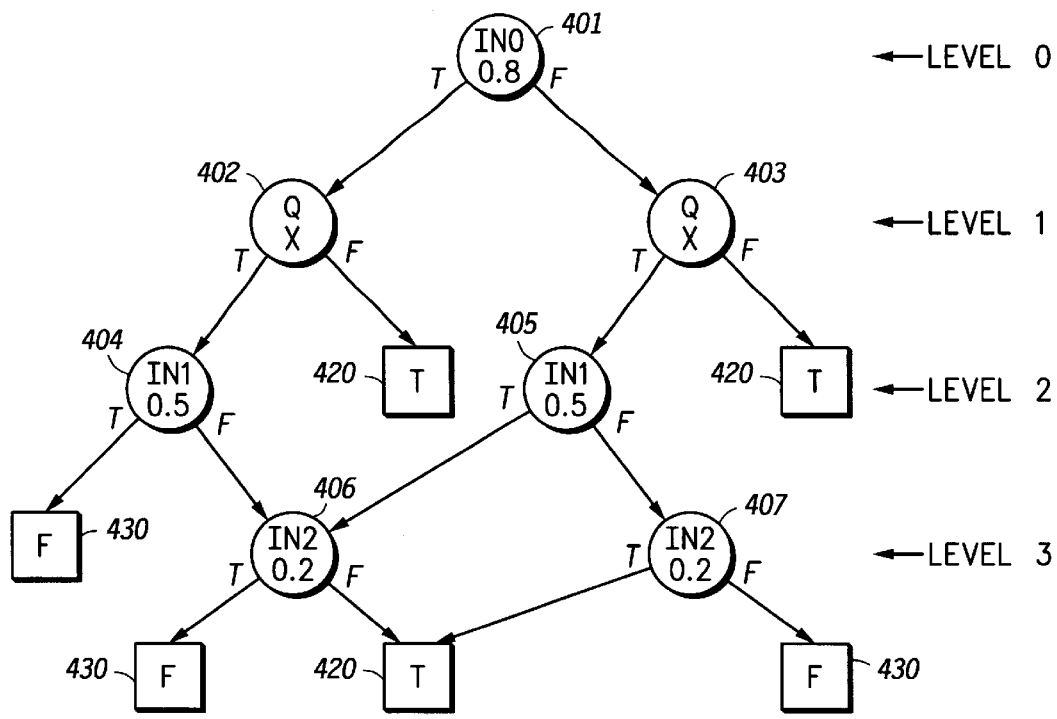

The BDD of FIG. 5 is a specific embodiment of a weighted logic data structure. The weight of each node is included within the circle designating the node. Specifically, input IN0 has a weighted value of 0.8, while inputs IN1 and IN2 respectively have weighted values of 0.5 and 0.2. In the embodiment illustrated, the weighted value indicates the likelihood of that input's true branch being taken relative to another input's true branch. In other words the true branch of input IN0 is intended to be taken more often than the true branch of input IN1. Further implication of the input weight will be discussed more in detail subsequently. For clarity, the weight of an input will be illustrated within all nodes representing that input in FIG. 5. Again, it should be noted, that it is not necessary to store the actual weighting value in a common data structure containing the node, but may actually be contained within a table such as that illustrated within FIG. 3.

Referring again to FIG. 4, a node 401 is labeled IN0 and is a level 0 node. The true branch from node 401 is connected to node 402, while the false branch from node 401 connects to node 403. Nodes 402 and 403 are the level 1 nodes representing the Q state. The true branch from node 402 is connected to node 404, while the false branch from node 402 connects to the true node 420. The true branch from node 403 is connected to node 405, while the false branch from node 401 connects to the true node 420. Nodes 404 and 405 are the level 2 nodes representing the IN1 variable. The true branch from node 404 is connected to the false node 430, while the false branch from node 404 is connected to node 406. The true branch from node 405 is connected to node 406, while the false branch from node 405 connects to the node 407. Nodes 406 and 407 are the level 3 nodes representing the IN2 variable. The true branch from node 406 is connected to the false node 430, while the false branch from node 406 connects to the true node 420. The true branch from node 407 is connected to the true node 420, while the false branch from node 407 connects to the false node 430.

At step 224 of FIG. 2, a simulator control program is generated. During simulation, at a user-specified point after initialization simulation controller 12 takes control of the simulator 14. This is accomplished by a control program resident in simulation controller 12. One example of a simulator control program is a program language interface or "PLI" program. A PLI program is an industry standard language for controlling simulators, such as the Verilog XL simulator. SimGen generates the simulation controller 12 as a PLI program. It is then possible for SimGen to control the simulator 14. At step 226, the simulator control program is linked to the simulator 14. By linking to the simulator 14, the simulation controller 12 can effectively take control of the simulator. Therefore, it would be possible for the simulation controller 12 to either allow a predefined set of vectors to be executed, such as would be executed at start-up or initialization of a design, or it would be possible for the simulation controller 12 to take control of the simulator 14. At step 228 the simulator is initialized. Initializing the simulator includes any simulation of the circuit necessary to obtain a desirable starting point from which to practice the embodiments of the present invention.

At step 230 of the present embodiment, control of the simulator is actually transferred to the simulation controller 12. In one embodiment, the simulation controller would effectively halt the simulated clock associated with the circuit being verified. By halting the simulated clock, the simulation controller 12 can analyze states internal to the circuit which are subject to verification. For example, referring to the BDD of FIGS. 4 and 5, the state of condition Q is an internal state of the circuit under test. Once the simulation controller 12 takes control of the simulator, and stops the clock, the simulation controller 12 may query the simulator in order to determine the value of the state of Q.

Following the transfer of control of simulator 14 to the simulation controller 12, and the subsequent stopping of the simulated clock, the current state of the circuit being simulated can be determined. This is done at step 232 where the process samples the current state of the circuit in simulation. The simulation control program samples the present state of the design and uses this information to generate simulation inputs for simulator 14. At step 234, the node weights of the logic data structure (BDD) are computed. In order to calculate the actual node weight of a specific node, it is necessary to resolve the actual weights using known values, which are available at the lowest level of the BDD diagram. The weights are based on the current state of the circuit. In this way, the process allows for feedback from the simulation in assigning and updating the BDD.

As an example of the computation of weights, again consider the BDD illustrated in FIG. 4, which is illustrated in FIG. 5 including true branch weights indicated in each input node. The computation of weights begins at the bottom of the BDD, as the weights of the terminal nodes are known. For example, node 430 is a false node and therefore its contribution to the weight of all of its coupled nodes (i.e. nodes which have directed arrows pointing to that node) is 0.0. Similarly, node 420 is a true node and its contribution to the weight is 1.0.

Figure 6:
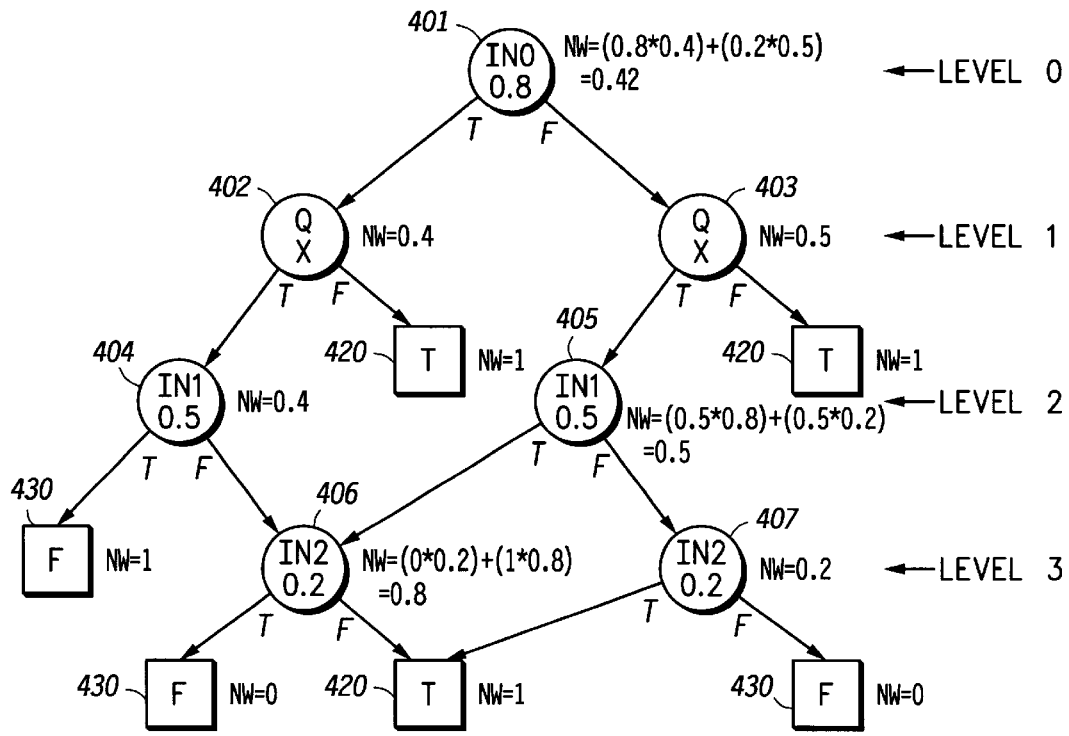

As illustrated in FIG. 6, starting with level 3, a specific weight for each node can be determined by first multiplying the weights assigned to each branch (the true/false branch has the truth/false branch weight of that node) by the weight of the node to which it points, and then summing the values obtained for each branch of the node. As an example, consider node 406; its weighted input value of the true branch is 0.2, (as given in the table of FIG. 3). The true branch points to false node 430, which has a weight of 0.0. Therefore the node weight attributed to node 406 from the true branch would be (0.0*0.2), or zero.

Next, the contribution from the false branch is added to this result. The false branch has a value of 0.8, or 1.0 minus the value of the true branch. The false branch points to the true node 420, which has a value of 1.0. Therefore the contribution of the false branch is (1.0*0.8) or 0.8. The false branch contribution is added to the true branch contribution, resulting in a weight for node 406 of 0.8. The weight of 0.8 is then assigned to node 406, and the next node is computed. The process continues to level 2, level 1, and finally level 0.

The notation used in FIG. 6 includes a true branch weight indicated within the node, and a node weight indicated beside each node, having the form "NW." For example, node 401 is an input node, with input indicated by IN0. The assigned weight of the true branch is 0.8, as given in the table of FIG. 3. The false branch weight is not provided, but is implicitly known from the true branch weight. The node weight is indicated in calculated form as:

"$NW=(0.8*0.4)+(0.2*0.5)=0.42$."

The assigned true branch weights are provided for nodes 404, 405, 406 and 407 according to the assignments given in the table of FIG. 3. The true branch weight for nodes 402 and 403 is given as "X," indicating that this will depend on the value of Q, because Q is an internal (state) signal. If the value of Q is 0, then its true branch weight is 0. If the value of Q is 1 then its true branch weight is 1. The effect of this is that if a state variable is 0 then the node weight of a state variable node is equal to the weight of the node pointed to by its false branch. Conversely, if the state variable is one then the node weight of state variable node is the weight of the node pointed to by its true branch. Node 420 contains a "T" indicating this is the terminal node TRUE. Node 430 contains a "F" indicating this is the terminal node FALSE.

The node weight values for the level 3 variables are used in the calculation of the level 2 variables. The node weight of node 405 is the sum of the true branch's contribution and the false branch's contribution, where the calculation is given as:

(node 406 weight*node true branch) weight+node 407 weight*node false branch weight.

According to the table of FIG. 3, node 405 has a true branch weight of 0.5, and therefore has a false branch weight of 0.5. The calculated weight of node 405, as given above, is 0.5. In a similar manner, the weight of node 404 is calculated to be 0.4. Because we are doing computation under the state in which Q is true. Nodes 402 and 403, representing the Q variable, are assigned the true branch weight of 1, and thus the false branch weight of 0.

According to above node weight computation, node 402 and 403 assume the node weight of their respective true branches. In other words, node 402 has the same node weight as node 404, or 0.4, and node 403 has the same node weight as node 405, or 0.5. Finally, using the node weights of nodes 402, and 403, the node IN0 is calculated resulting in a weight of 0.42.

Note that by sampling the current state of the circuit the value of Q can be determined. In FIG. 5 the node weight value of nodes 402 and 403 is indicated by an "X," where the weight is not known until the state Q is known. This is iteratively updated and provided to simulation controller 12, which then recalculates the weights for BDD nodes. After the current state of the circuit is known and all node weights are calculated, flow proceeds to step 236 where generation of simulation inputs occurs.

Generation of the simulation inputs depends upon an actual calculation of the likelihood of the true branch being taken based upon the node weights calculated in step 234. Simulation controller 12 generates simulation inputs appropriate to the present state, and the branching probabilities that will be discussed in the next paragraph. Once the simulation controller 12 has settled on a stable model, simulator 14 simulates the design using that model. After this simulation, the present state of the circuit is sampled and the process continues as before. A user-determined stop criteria, such as a maximum time or a maximum number of cycles, or a false final result will stop the process. At each clock cycle, the outcome of simulation either results in an input that satisfies the constraints or results in no valid inputs for the current state. If there are no valid inputs the program aborts. This typically can occur when there are some constraints involving only state variables or if the user-defined weights eliminated all possible successful paths.

Figure 7:
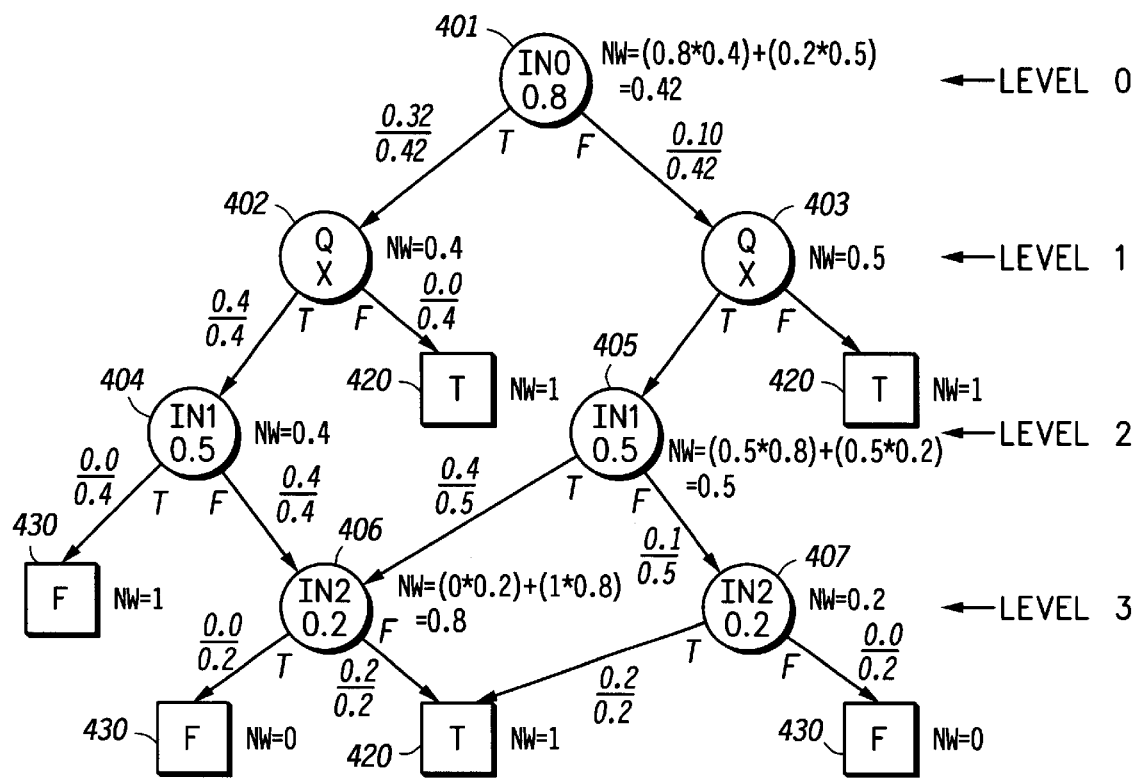

Successful verification results when inputs are found which satisfy the constraints and the branching probabilities. According to one embodiment, the branching probability of a true branch being taken is calculated by multiplying the true path weight of a node by the node weight of the node to which the true transition occurs. This product is divided by the node weight of the node being analyzed. Therefore, to determine a simulation input value for the input IN0 at node 401, the process first determines the likelihood that the bit is set, i.e. the branching probability of taking the true branch. The probability for node 401 is calculated by first multiplying the true branch weight of 0.8 by the node weight of node 402 of 0.4. This is then divided by the node weight of node 401 of 0.42. The branching probability is then equal to (0.8*0.4)/0.42, or approximately 0.76. The value may have a notation given as 0.32/0.42, as illustrated in FIG. 7. The notation provided in FIG. 7 is similar to that of FIG. 6, with the addition of the probability information which is provided along each branch, indicating the probability of that branch being included in a path that results in a final TRUE outcome.

Conversely, the likelihood of the false branch to be taken is given as 1 minus the branching probability of the true branch being taken, or 0.10/0.42. Based upon this information a random number generator, or other appropriate means would be used to predict which branch is to be taken. The actual value of that particular input bit is then determined based on the branch prediction. According to the present embodiment, if the true branch is to be taken the input bit is set to 1. In this manner the individual bits associated with the constraints are set one at a time until a suited random vector has been generated.

Figure 8:
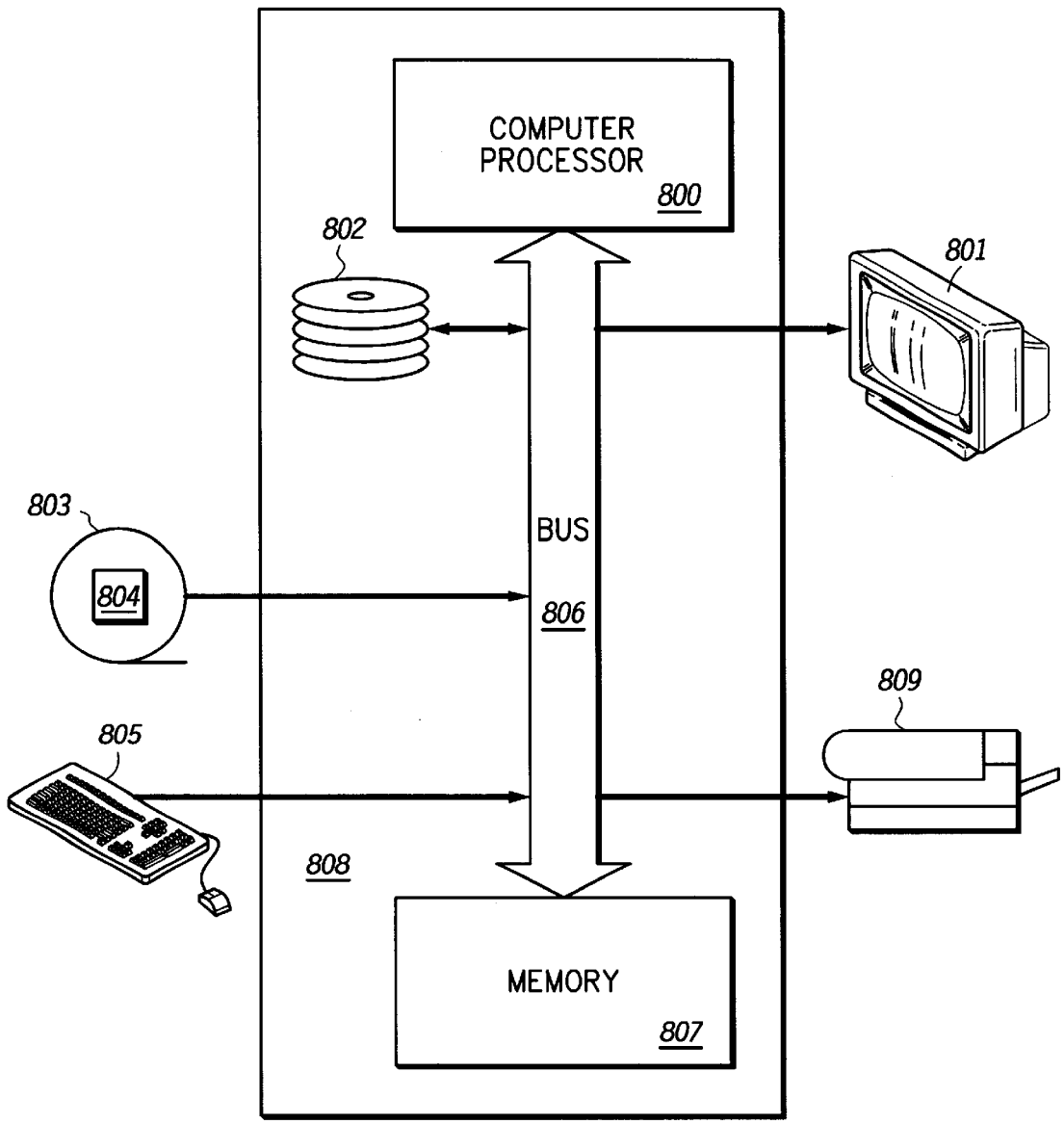
FIG. 8 illustrates, in block diagram form, a General Purpose Computer on which the extended precision formats shown in FIGS. 2 and 3 can be utilized.

FIG. 8 is a block diagram illustrating a General Purpose Computer 808 on which the design verification methods described hereinabove can be utilized. The General Purpose Computer 808 has a Computer Processor 800, and Memory 807, connected by a Bus 806. Memory 807 is a relatively high speed machine readable medium and includes Volatile Memories such as DRAM, and SRAM, and Non-Volatile Memories such as, ROM, FLASH, EPROM, EEPROM, and bubble memory. Also connected to the Bus are Secondary Storage 802, External Storage 803, output devices such as a monitor 801, input devices such as a keyboard (with mouse) 805, and printers 809.

Secondary Storage 802 includes machine readable media such as hard disk drives, magnetic drum, and bubble memory. External Storage 803 includes machine readable media such as floppy disks, removable hard drives, magnetic tape, CD-ROM, and even other computers, possibly connected via a communications line. The distinction drawn here between Secondary Storage 802 and External Storage 803 is primarily for convenience in describing the invention. As such, it should be appreciated that there is substantial functional overlap between these elements.

Computer software such as programs implementing the methods disclosed herein such as utilizing the two different extended precision formats for calculation of encryption key values and user programs can be stored in a Computer Software Storage Medium, such as memory 807, Secondary Storage 802, and External Storage 803. Executable versions of computer software 804, can be read from a Non-Volatile Storage Medium such as External Storage 803, Secondary Storage 802, and Non-Volatile Memory and loaded for execution directly into Volatile Memory, executed directly out of Non-Volatile Memory, or stored on the Secondary Storage 802 prior to loading into Volatile Memory for execution.

The methods disclosed herein provide for verification of circuit design using both formal verification and simulation, especially useful when for verification of very large scale integrated circuits. Those skilled in the art will recognize that modifications and variations can be made without departing from the spirit of the invention. For example, alternate logic data structures may be used to implement the verification method incorporating formal verification into the simulation of circuit designs. Therefore, it is intended that this invention encompass all such variations and modifications as fall within the scope of the appended claims.

What is claimed is:

1. A program storage device readable by a machine, tangibly embodying a program of instructions executable by the machine to perform a method for verifying a design of an integrated circuit, the integrated circuit having a set of functional constraints, the method comprising:

generating a logic data structure based on the set of functional constraints, the logic data structure comprising a plurality of nodes, each of the plurality of nodes having at least one branch, wherein each of the plurality of nodes represents an input signal used in the integrated circuit, wherein each input signal has an associated weight;

assigning a node weight to each of the plurality of nodes based on the associated weight;

assigning a branching probability to each branch of each of the plurality of nodes based on the logic data structure and the associated weight;

generating a first set of simulation inputs based on the logic data structure and branching probabilities;

generating a simulation control program using the first set of simulation inputs to control simulation of the design of the integrated circuit;

initializing simulation of the design of the integrated circuit;

simulating the design of the integrated circuit;

determining at least one state condition of the design of the integrated circuit; and adjusting branching probabilities in response to the at least one state condition.

2. The program storage device of claim 1 wherein the method further comprises:

after generating the logic data structure and before generating the first set of simulation inputs, reducing size of the logic data structure that is being generated by the machine by selectively grouping and using variables used to generate the logic data structure.

3. The program storage device of claim 1, wherein the logic data structure is a binary decision diagram (BDD).

4. A program storage device readable by a machine, tangibly embodying a program of instructions executable by the machine to perform a method for verifying a design of an integrated circuit, the integrated circuit having a set of functional constraints, the method comprising:

generating a binary decision diagram (BDD) based on the set of functional constraints, the binary decision diagram comprising a plurality of nodes, each of the plurality of nodes having at least one branch, wherein each of the plurality of nodes represents an input signal used in the integrated circuit, wherein each input signal has an associated weight;

reordering the binary decision diagram;

assigning a node weight to each of the plurality of nodes based on the associated weight;

assigning a branching probability to each branch of each of the plurality of nodes based on the logic data structure and the associated weight;

generating a first set of simulation inputs based on the logic data structure and branching probabilities;

generating a simulation control program for simulating the design of the integrated circuit;

initializing simulation of the design of the integrated circuit;

simulating the design of the integrated circuit;

determining at least one state condition of the design of the integrated circuit; and adjusting branching probabilities in response to the at least one state condition.

5. The program storage device of claim 4, wherein the plurality of nodes includes at least one node defined by the set of functional constraints.

6. The program storage device of claim 5, wherein the step of reordering the BDD comprises incorporating at least one state variable into the plurality of nodes.

7. The program storage device of claim 1, wherein the method further comprises:

performing a formal verification of at least one portion of the design of the integrated circuit using the set of functional constraints.

8. A computer storage medium readable by a computer and storing a program of instructions executable by the computer to implement a circuit design verification tool, the circuit design verification tool comprising:

a logic compiler, the logic compiler receiving a design file, a set of design constraints and a set of weights, the logic compiler building a logic data structure that incorporates state information to represent an input space which satisfies the set of design constraints;

a control program generator for generating a control program, the control program generator receiving the logic data structure from the logic compiler, the control program generator generating a simulation control program based on the logic data structure and assigning branching probabilities to the logic data structure corresponding to the set of weights; and a simulation program code means, the simulation program code means simulating a circuit design in response to receiving the simulation control program from the control program generator, the simulation program code means providing a current state condition to the control program generator which the control program generator uses to adjust the branching probabilities.

9. The computer storage medium of claim 8 executable to implement circuit design verification, wherein the control program generator further uses the current state condition to produce a valid input vector for the logic data structure, the valid input vector satisfying the set of design constraints.

10. The computer storage medium storing the circuit design verification tool of claim 8, wherein the set of design constraints are applicable for use in formal verification of at least a portion of the design of the integrated circuit.

11. The computer storage medium storing the circuit design verification tool of claim 8, wherein the logic data structure comprises a binary decision diagram (BDD).

12. The computer storage medium storing the circuit design verification tool of claim 11, wherein the BDD comprises a plurality of binary input nodes and a plurality of state nodes;

wherein a vector has an associated probability of selection; and wherein reordering of the BDD does not alter the associated probability of selection of the vector.

13. The computer storage medium storing the circuit design verification tool of claim 12, wherein a first state node of the BDD has a binary value which complies with a current state condition and the associated branching probability of the first state node is the binary value.

14. The computer storage medium storing the circuit design verification tool of claim 8, wherein the set of design constraints comprises a first portion and a second portion, wherein the first portion defines a first set of inputs and the second portion defines a second set of inputs, and wherein the first set of inputs is disjoint from the second set of inputs.

15. An article of manufacture comprising:

a computer usable medium having computer readable program code means embodied therein for circuit design verification, the computer readable program code means in said article of manufacture comprising:

a first computer readable program code means for receiving design file information and design constraint information;

a second computer readable program code means for generating a weighted binary decision diagram (BDD) data structure, the weighted BDD having a plurality of binary nodes corresponding to functional signals within a circuit, each of the plurality of binary nodes having two edges;

a third computer readable program code means for generating simulation controls based on the weighted BDD, the third means assigning an associated branching probability to each of the two edges; and a fourth computer readable program code means for providing at least one current state condition within the weighted binary decision diagram data structure to the third computer program code means, the third computer readable program code means adjusting branching probability in response to the at least one current state condition.

16. The article of manufacture of claim 15, further comprising:

a fifth computer readable program code means for repetitively providing current state information to the third computer program code means in response to a predetermined number of repetitions of simulations of the circuit;

wherein the third computer readable program code means adjusts associated branching probabilities in response to the current state information.

17. A circuit design verifier stored on a computer readable medium, the circuit design verifier for verifying a design of an integrated circuit having a set of functional constraints, comprising:

computer readable first program code means for generating a logic data structure based on the set of functional constraints, the logic data structure comprising a plurality of nodes, wherein each of the plurality of nodes represents an input signal to the integrated circuit, wherein each of the plurality of input signals has a associated weight;

computer readable second program code means for assigning a probability to each of the plurality of nodes based on the associated weight;

computer readable third program code means for generating a first set of simulation inputs based on the logic data structure and probabilities; and computer readable fourth program code means for controlling simulation design of the integrated circuit using the first set of simulation inputs and at least a second subsequent set of simulation inputs derived from at least one state condition determined after using the first set of simulation inputs.

\* \* \* \* \*